(12) United States Patent
Chu et al.

(10) Patent No.: US 10,192,777 B2
(45) Date of Patent: Jan. 29, 2019

(54) METHOD OF FABRICATING STI TRENCH

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Hsien-Shih Chu, Kaohsiung (TW); Ming-Feng Kuo, Tainan (TW); Yi-Wang Zhan, Taichung (TW); Li-Chiang Chen, Tainan (TW); Fu-Che Lee, Taichung (TW); Feng-Yi Chang, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/854,765

(22) Filed: Dec. 27, 2017

(65) Prior Publication Data
US 2018/0190538 A1 Jul. 5, 2018

(30) Foreign Application Priority Data

Dec. 29, 2016 (CN) .......................... 2016 1 1242434

(51) Int. Cl.
*H01L 21/762* (2006.01)
*H01L 29/06* (2006.01)
*H01L 21/308* (2006.01)
*H01L 21/3065* (2006.01)
*H01L 21/02* (2006.01)

(52) U.S. Cl.
CPC .... *H01L 21/76224* (2013.01); *H01L 21/0217* (2013.01); *H01L 21/02164* (2013.01); *H01L 21/3065* (2013.01); *H01L 21/3081* (2013.01); *H01L 21/3086* (2013.01); *H01L 29/0649* (2013.01)

(58) Field of Classification Search
None
See application file for complete search history.

(56) References Cited

U.S. PATENT DOCUMENTS

| 2004/0038493 | A1* | 2/2004 | Shih .................. H01L 21/76224 438/424 |
| 2005/0191822 | A1* | 9/2005 | Liu ..................... H01L 21/3086 438/424 |
| 2012/0126244 | A1* | 5/2012 | Zhong ............... H01L 21/76224 257/77 |

(Continued)

*Primary Examiner* — Asok K Sarkar
(74) *Attorney, Agent, or Firm* — Winston Hsu

(57) ABSTRACT

A method of fabricating an STI trench includes providing a substrate. Later, a first mask is formed to cover the substrate. The first mask includes numerous sub-masks. A first trench is disposed between each sub-mask. Subsequently, a protective layer is formed to fill up the first trench. Then, a second mask is formed to cover the first mask. The second mask includes an opening. The sub-mask directly disposed under the opening is defined as a joint STI pattern. After that, the joint STI pattern is removed to transform the first mask into a third mask. Later, the second mask is removed followed by removing the protective layer. Finally, part of the substrate is removed by taking the third mask as a mask to form numerous STI trenches.

7 Claims, 6 Drawing Sheets

(56) References Cited

U.S. PATENT DOCUMENTS

2015/0348870 A1* 12/2015 Feilchenfeld ......... H01L 21/743
 257/506
2015/0380259 A1* 12/2015 Chang ................ H01L 21/3086
 438/702
2018/0174966 A1* 6/2018 Zhu .................... H01L 23/5283

* cited by examiner

METHOD OF FABRICATING STI TRENCH

BACKGROUND OF THE INVENTION

1. Field of the Invention

The present invention relates to a method of fabricating a shallow trench isolation (STI) trench, and more particularly to a method of precisely defining the position of the STI trench by using a protective layer.

2. Description of the Prior Art

Device Isolation Technology is an important process in IC fabrication for electrically isolating the various active components in the IC. As integration becomes higher, isolation becomes more difficult. A conventional method for device isolation is the so-called Local Oxidation of Silicon (LOCOS) technique, which is used to provide field oxide layers to serve as isolation structures in the integrated circuit. One drawback to the LOCOS technique, however, is that the resulting isolation structure has a bird's beak shape that makes the further downsizing of the IC device difficult to realize. The STI (shallow trench isolation) technique serves as a solution to the drawback of the LOCOS technique, and which is now widely used in semiconductor fabrication.

A conventional method for fabricating an STI includes forming STI trenches in a substrate followed by filling an insulating layer to provide isolation property. However, as integration becomes higher, it is problematic that when etching the substrate to form STI trenches, a predetermined position of an active area on the substrate is also damaged.

SUMMARY OF THE INVENTION

In view of the above, it would be an advantage in the art to provide a method of fabricating an STI trench which is not subject to unwanted damage to an active area.

According to a preferred embodiment of the present invention, a method of fabricating an STI trench includes providing a substrate. Later, a first mask is formed to cover the substrate, and the first mask includes numerous sub-masks, wherein a first trench is disposed between the adjacent sub-masks. Subsequently, a protective layer is formed to fill up the first trench. Later, a second mask is formed to cover the first mask, and the second mask includes an opening. The sub-mask directly under the opening is defined as a joint STI pattern. Then, the joint STI pattern is removed to transform the first mask into a third mask by taking the second mask as a first protective mask. Next, the second mask is removed. Later, the protective layer is removed. Finally, part of the substrate is removed to form numerous STI trenches by taking the third mask as a second protective mask.

According to a preferred embodiment, the first mask includes a first material, the protective layer includes a second material, the first material has a high etching selectivity ratio relative to the second material with respective to a predetermined etchant.

According to a preferred embodiment, the first material includes silicon nitride, the protective layer includes silicon oxide, and the predetermined etchant includes fluorine-containing gas These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depict a method of fabricating an STI trench according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8;
and
FIG. 10 is a fabricating stage following FIG. 9.

DETAILED DESCRIPTION

Figure 1:
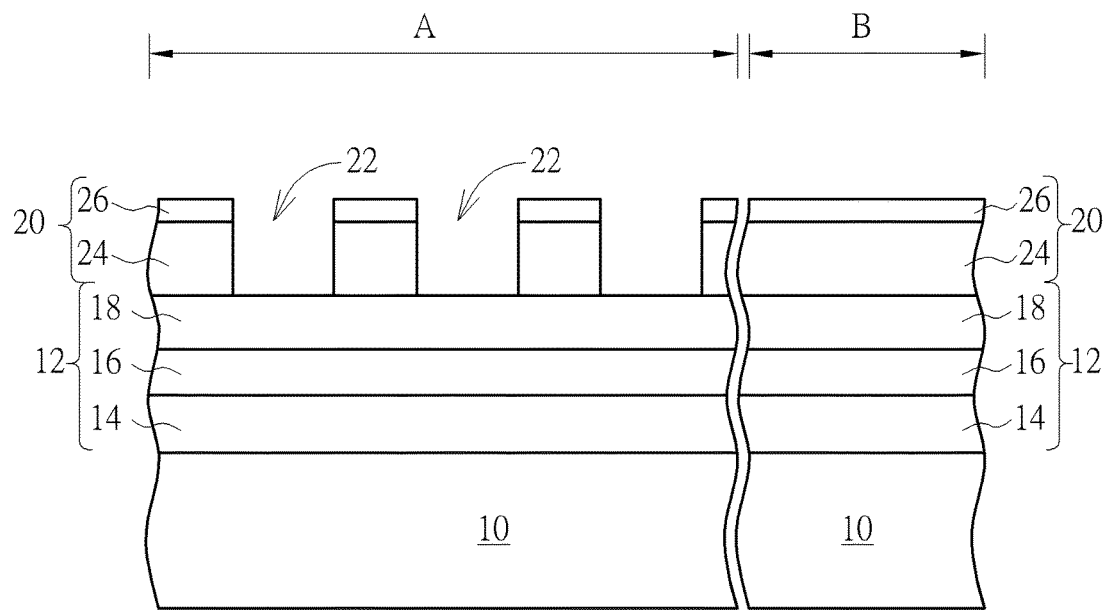
Figure 2:
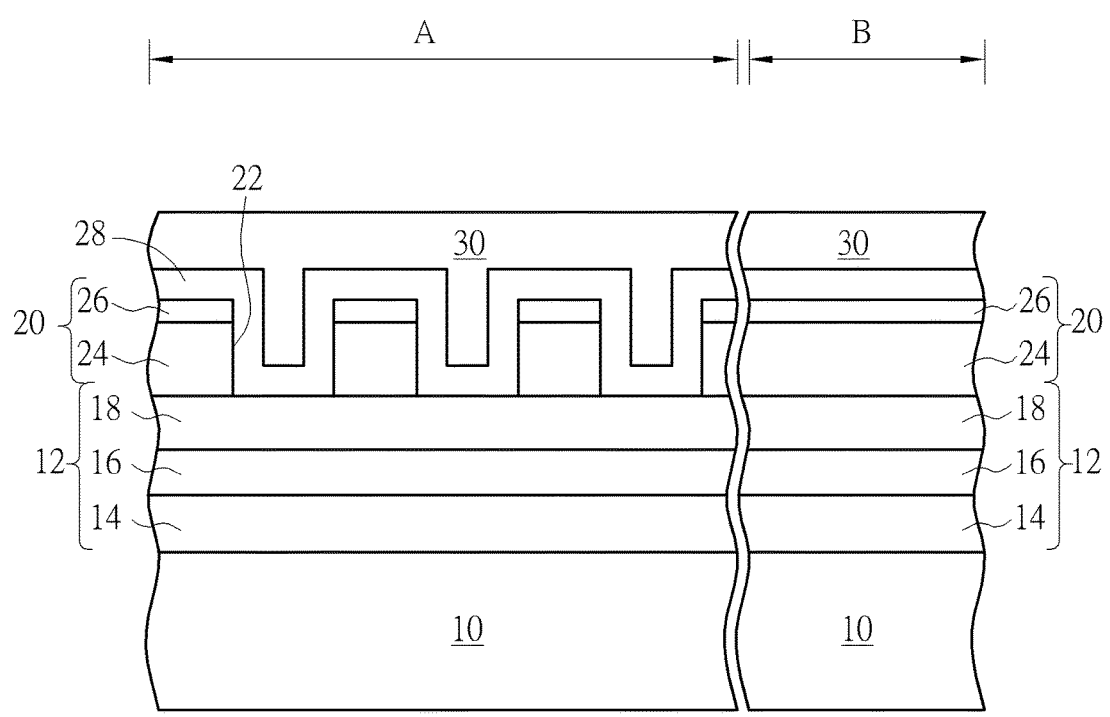
Figure 3:
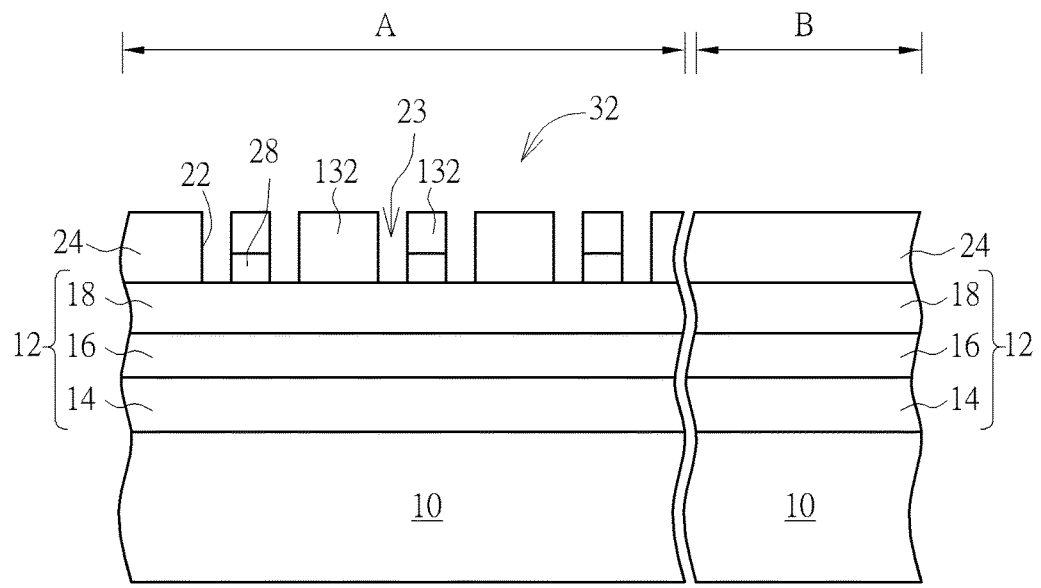

FIG. 1 to FIG. 10 depict a method of fabricating an STI trench according to a preferred embodiment of the present invention. As shown in FIG. 1, a substrate 10 is provided. The substrate 10 is divided into an active array region A and a peripheral circuit region B. A material layer 12 is formed to cover the substrate 10. The material layer 12 maybe a single material or a stacked material. The material layer 12 includes silicon oxide, amorphous silicon, silicon nitride or silicon oxynitride. According to a preferred embodiment of the present invention, the material layer 12 is a stacked material including a silicon oxide layer 14, an amorphous silicon layer 16 and a silicon nitride 18 stacked from bottom to top. The thickness of the silicon oxide layer 14 is preferably 1300 angstroms. The thickness of the amorphous silicon layer 16 is preferably 700 angstroms. The thickness of the silicon nitride 18 is preferably 400 angstroms. Later, a first patterned mask layer 20 is formed. The first patterned mask layer 20 includes numerous openings 22. The first patterned mask layer 20 is made of an organic dielectric layer 24 and a silicon-containing hard mask bottom anti-reflection coating (SHB) 26. As shown in FIG. 2, a silicon oxide layer 28 is formed to conformally cover the first patterned mask layer 20. The thickness of the silicon oxide layer 28 is preferably between 20 and 23 nanometers. For example, the thickness of the silicon oxide layer 28 is 21.5 nanometers. Subsequently, a sacrifice layer such as an organic dielectric layer 30 is formed to cover the silicon oxide layer 28 and fill in each of the openings 22. The organic dielectric layer 30 preferably has the same etching ratio as that of the organic dielectric layer 24 with respective to the same etchant. As shown in FIG. 3, the organic dielectric layer 30 is etched back. Later, the etchant used to remove the organic dielectric layer 30 is changed to another etchant which etches the silicon oxide layer 28 on the top surface of the organic dielectric layer 30, and the silicon oxide layer 28 on the sidewall of the opening 22. Now, a second patterned mask layer 32 is formed. The second patterned mask layer 32 is made of the organic dielectric layer 24 and the remaining silicon oxide layer 28. The second patterned mask layer 32 includes numerous sub-masks 132. Furthermore, the trench 23 is disposed between the adjacent sub-masks 132. The width of the trench 23 is corresponding to the thickness of the silicon oxide layer 28

. The width of the trench 23 is preferably between 20 and 23 nanometers. For example, the width of the trench 23 is 21.5 nanometers.

Figure 4:
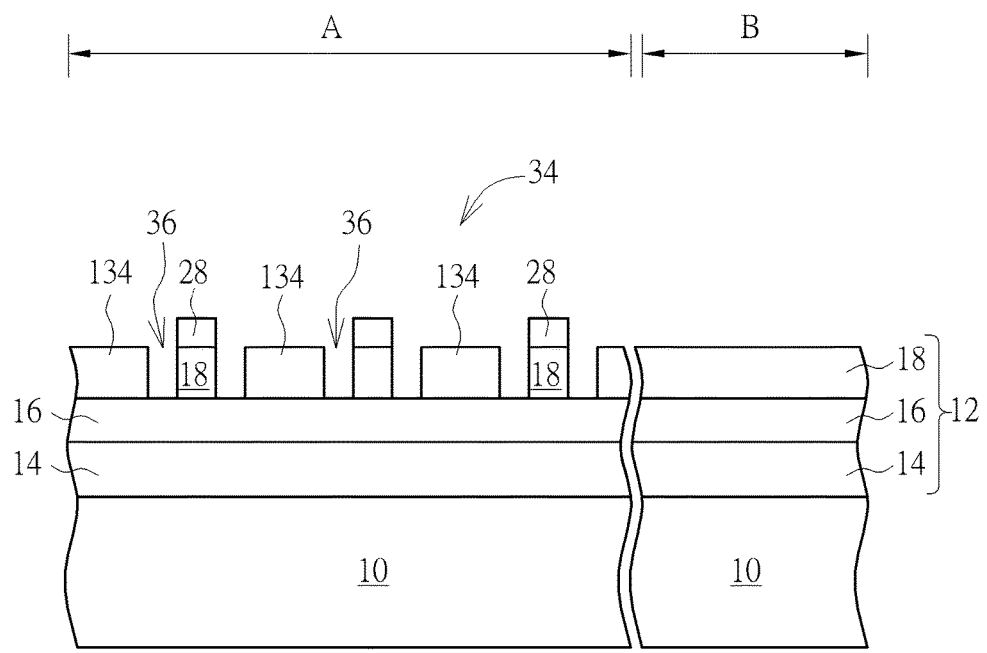

As shown in FIG. 4, the material layer 12 is patterned by using the steps of transferring the pattern on the second patterned mask layer 32 to the material layer 12 by taking the second patterned mask layer 32 as a mask. The method of patterning the material layer 12 is preferably a dry etching process. Now, the material layer 12 which is patterned forms a first mask 34. Later, the organic dielectric layer 24 within the second patterned mask layer 32 is removed, and the silicon oxide layer 28 within the second patterned mask layer 32 is remained. According to another preferred embodiment of the present invention, the silicon oxide layer 28 within the second patterned mask layer 32 can be removed as well. Subsequent figures show the silicon oxide layer 28 within the second patterned mask layer 32 is remained as an example. Moreover, if the material layer 12 is a stacked material, the first mask 34 is formed within the topmost layer of the material layer 12. For example, if the material layer 12 includes the silicon oxide layer 14, the amorphous layer 16 and the silicon nitride layer 18 disposed from bottom to top. The first mask 34 is only formed within the silicon nitride layer 18, and there are not any patterns within the silicon oxide layer 14, and the amorphous layer 16. The first mask 34 includes numerous sub-masks 134. A first trench 36 is disposed between the adjacent sub-masks 134. The width of first trench 36 is between 20 and 23 nanometers, such as 21.5 nanometers.

Figure 5:
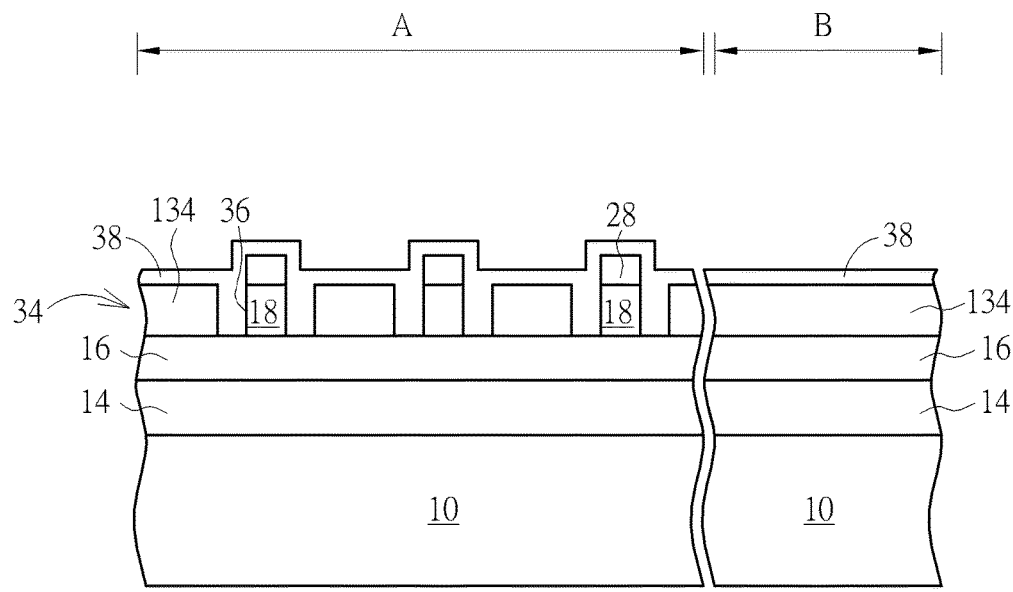

As shown in FIG. 5, a protective layer 38 is formed to conformally cover each of the sub-masks 134 and fill up the first trench 36. The protective layer 38 is preferably a single layer material. The first mask 34 includes a first material, the protective layer 38 includes a second material, the first material has a high etching selectivity ratio relative to the second material with respective to a predetermined etchant. That is, when using the same etchant, the etchant has very different etching rates to the first mask 34 and to the protective layer 38. The etchant can etch the first mask 34 but can't etch the protective layer 38. The protective layer 38 includes silicon oxide, silicon nitride, amorphous silicon or silicon oxynitride. According to a preferred embodiment of the present invention, the protective layer 38 is preferably silicon oxide. The thickness of the protective layer 38 is greater than half of the width of the first trench 36 to ensure the protective layer 38 can fill up the first trench 36. For example, the thickness of the protective layer 38 is greater than 12 nanometers. The protective layer 38 may be formed by an atomic layer deposition (ALD), a chemical vapor deposition (CVD), a physical vapor deposition (PVD) or other suitable methods.

Figure 6:
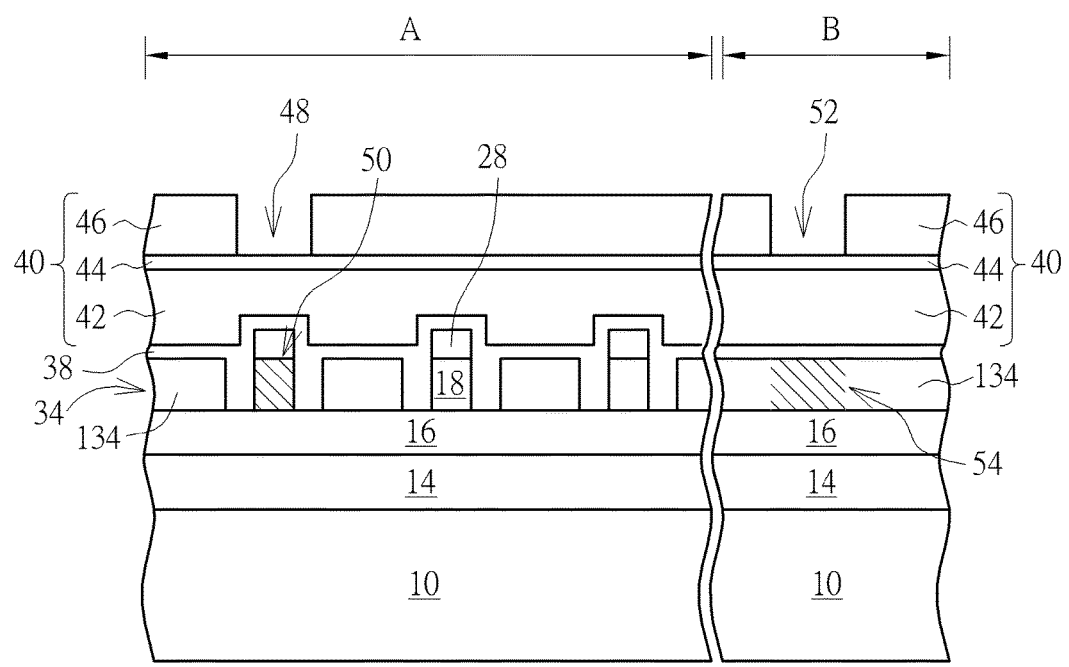

As shown in FIG. 6, a second mask 40 is formed to cover the first mask 34. The second mask 40 may be a single layer material, or a stacked material. In the present invention, the second mask 40 is preferably a stacked material. The second mask 40 includes an organic dielectric layer 42, an SHB 44 and a photoresist 46 disposed from bottom to top. The second mask 40 includes at least an opening 48. The opening 48 can be only disposed within the photoresist 46. That is, the opening 48 does not extend into the SHB 44 and the organic dielectric layer 42. In other embodiment, the opening 48 may penetrate the entire second mask 40. Moreover, the position of the opening 48 is used to define the joint region of two STIs. The sub-mask 134 directly below the opening 48 is defined as a joint STI pattern 50 (marked by slashes). The protective layer 38 contacts the two opposite sidewalls of the joint STI pattern 50. In one embodiment, a sidewall of the openings 48 may be aligned with a sidewall of the joint STI pattern 50. In another embodiment, the sidewall of the openings 48 may be aligned with any region within the protective layer 38 at two sides of the joint STI pattern 50. FIG. 6 shows the sidewall of the opening 48 aligned with the middle of the protective layer 38 at two sides of the joint STI pattern 50 as an example. The second mask 40 may further include an opening 52. The position of the opening 52 is used to define the position of the STI within the peripheral circuit region B. The sub-mask 134 directly below the opening 52 within the peripheral circuit region B is defined as a peripheral STI pattern 54 (marked by slashes).

Figure 7:
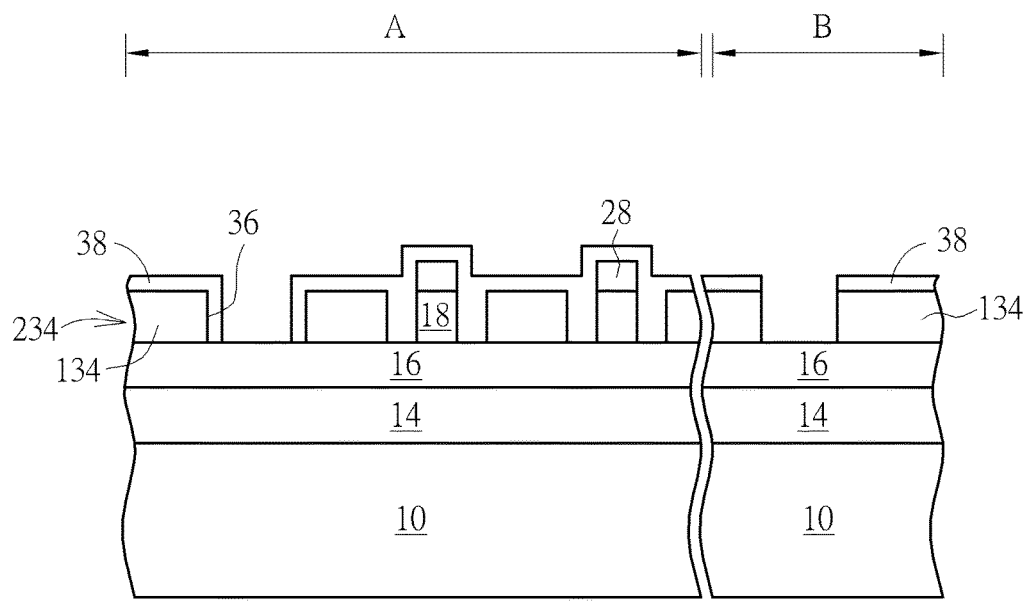
Figure 8:
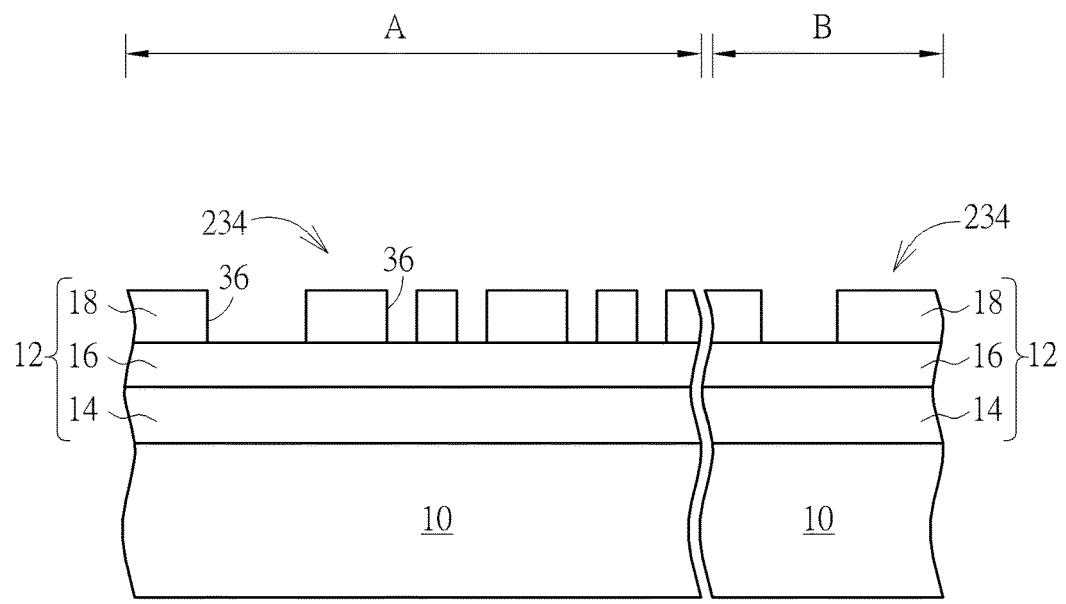

As shown in FIG. 7, the joint STI pattern 50 and the peripheral STI pattern 54 are removed by taking the second mask 40 as a mask. There is the protective layer 38 at two sides of the joint STI pattern 50, and the joint STI pattern 50 and the protective layer 38 has a high etching ratio with respective to the same etchant. This etching ratio is preferably above 10. Therefore, the protective layer 38 can serve as an etching stop layer when removing the joint STI pattern 50. In this way, the sub-mask 134 adjacent to the joint STI pattern 50 will not be removed when removing the joint STI pattern 50. In details, the steps of removing the joint STI pattern 50 and the peripheral STI pattern 54 include using the fluoride-containing gas to dry etch the protective layer 38 on the top surface of the joint STI pattern 50 and the top surface of the peripheral STI pattern 54. Later, fluoroform ($CHF_3$) is used to dry etch the joint STI pattern 50 and the peripheral STI pattern 54. Now, the protective layer 38 within the first trench 36 serves as an etching stop layer of fluoroform. After removing the joint STI pattern 50 and the peripheral STI pattern 54, the first mask 34 is transformed into a third mask 234. Now, the protective layer 38, the silicon oxide layer 28 and the second mask 40 still cover the third mask 234. Then, the second mask 40 is removed. As shown in FIG. 8, the protective layer 38 is entirely removed. In addition, because the protective layer 38 is silicon oxide, the silicon oxide layer 28 is removed while removing the protective layer 38, and the third mask 234 is entirely exposed. The protective layer 38 may be entirely removed by a wet etching, for instance, a treatment with dilute aqueous hydrofluoric acid solution (DHF).

Figure 9:
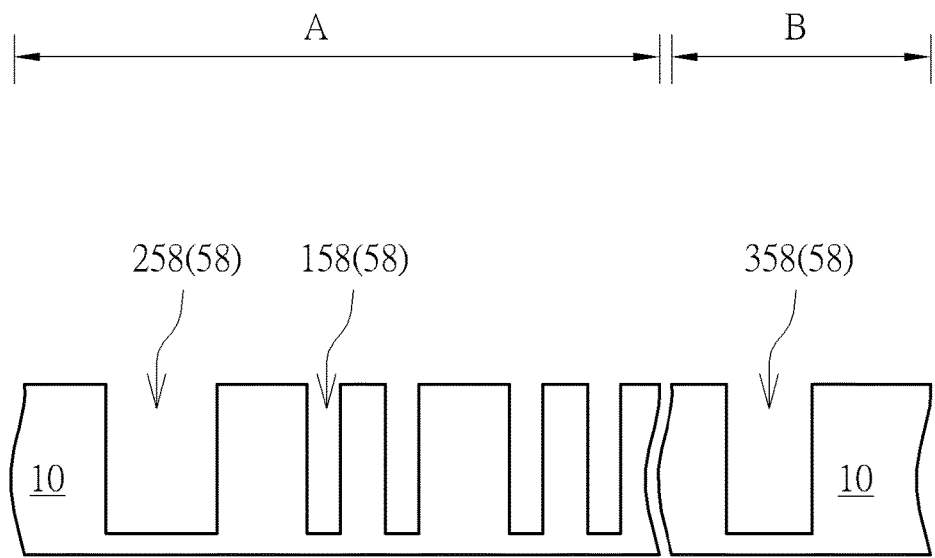

As shown in FIG. 8 and FIG. 9, the substrate 10 is removed partly to form numerous STI trenches 58 in the substrate 10 by taking the third mask 234 as a mask. The step of removing the substrate 10 is preferably by a dry etching. The dry etching can be performed in a tilted angle to etch the substrate 10. In this way, the opening of the STI trench 58 will be smaller than the opening in the third mask 234. For example, if the width of the first trench 36 is 21.5 nanometers, the width of the opening of the trench 158 can be decreased to 18 nanometers. In this embodiment, the substrate 10 is dry etched in a perpendicular angle; therefore the width of the opening of the STI trench 58 is the same as the width of the opening in the third mask 234. Moreover, as mentioned above, the material layer 12 is a stacked material, and the third mask 234 is formed within the topmost layer of the stacked material. Therefore, when forming the STI trench 58, the material layers in the stacked material below the topmost layer should be etched first by taking the third mask 234 as a mask, and the substrate 10 is etched afterwards. In details, the amorphous silicon layer 16 and the silicon oxide layer 14 are etched by taking the third mask 234 within the silicon nitride 18 as a mask. Furthermore, while etching the substrate 10, the amorphous silicon layer 16 and the silicon oxide layer 14 are thinned, or even consumed entirely. If there is some remained silicon oxide layer 14 after etching the substrate 10, the remaining silicon oxide layer 14 can be removed by a wet etching, for instance, a treatment with dilute aqueous hydrofluoric acid solution. A trench 158 of the STI trench 58 will form a STI after filling in an insulating layer. A trench 258 of the STI trench 58 will form a joint STI after filling in an insulating layer. The joint STI is to connect two adjacent STIs. A trench 358 of the STI trench 58 will form a STI in the peripheral circuit region B after filling an insulating layer. The width of the opening of the trench 158 is preferably between 13 and 18 nanometers. The width of the opening of the trench 258 is preferably between 46 and 54 nanometers. The width of the opening of the trench 358 is preferably between 13 and 54 nanometers. The depths of the trench 158, the trench 258 and the trench 358 are preferably between 2500 and 3500 nanometers.

Figure 10:
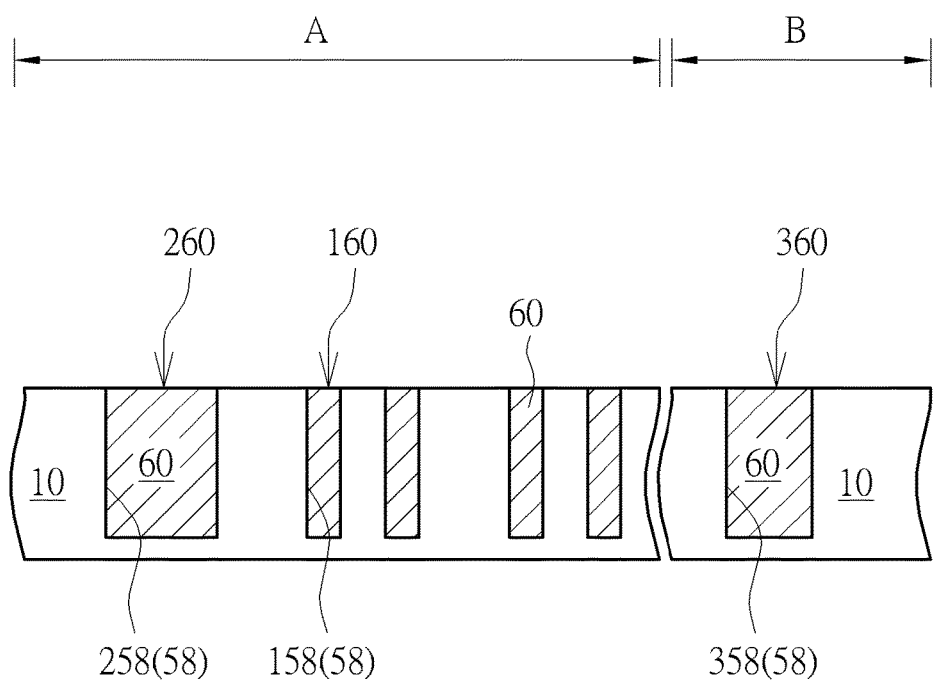
Figure 11:
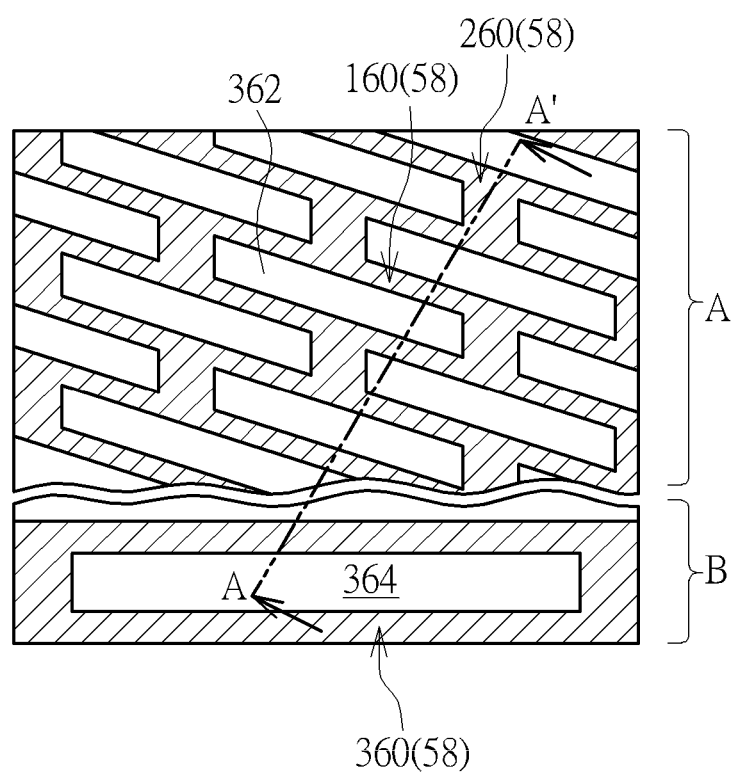
FIG. 11 shows a top view of a STI in an active array region and in a periphery circuit region.

FIG. 11 shows a top view of a STI in an active array region and in a periphery circuit region. FIG. 10 is a sectional view taken along line AA' in FIG. 11. Please refer to FIG. 10 and FIG. 11, an insulating layer 60 is filled into the trench 158, the trench 258 and the trench 358 to form STI 160, the joint STI 260 and STI 360. The STI 160 and the joint STI 260 within the active array region A defines an active region 362. The STI 360 within the peripheral circuit region B defines an active region 364.

The present invention utilizes the protective layer to ensure that the sub-masks are not damaged when removing the joint STI pattern. In this way, the STIs formed afterward will not occupy the active region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a shallow trench isolation (hereafter abbreviated as STI) trench, comprising:
    providing a substrate;
    forming a first mask covering the substrate, and the first mask comprising a plurality of sub-masks, wherein a first trench is disposed between the sub-masks adjacent to each other;
    forming a protective layer filling up the first trench;
    forming a second mask covering the first mask, and the second mask comprising an opening, wherein one of the sub-masks directly under the opening is defined as a joint STI pattern;
    removing the joint STI pattern to transform the first mask into a third mask by taking the second mask as a first protective mask;
    removing the second mask;
    removing the protective layer; and
    removing part of the substrate to form a plurality of STI trenches by taking the third mask as a second protective mask.

2. The method of fabricating an STI trench of claim 1, wherein the first mask comprises a first material, the protective layer comprises a second material, the first material has a high etching selectivity ratio relative to the second material with respective to a predetermined etchant.

3. The method of fabricating an STI trench of claim 2, wherein the first material comprises silicon nitride, the protective layer comprises silicon oxide, and the predetermined etchant comprises fluorine-containing gas.

4. The method of fabricating an STI trench of claim 1, further comprising while removing the joint STI pattern, removing part of the protective layer adjacent to the joint STI pattern.

5. The method of fabricating an STI trench of claim 1, wherein a sidewall of the opening is aligned with a sidewall of the joint STI pattern.

6. The method of fabricating an STI trench of claim 1, wherein a sidewall of the opening is aligned with the protective layer adjacent to the joint STI pattern.

7. The method of fabricating an STI trench of claim 1, further comprising:
    after forming the STI trenches, removing the third mask; and
    forming an insulating layer filling into the STI trenches.

* * * * *